United States Patent [19]

Khayat

[11] Patent Number: 5,336,942
[45] Date of Patent: Aug. 9, 1994

[54] HIGH SPEED SCHMITT TRIGGER WITH PROCESS, TEMPERATURE AND POWER SUPPLY INDEPENDENCE

[75] Inventor: Joseph M. Khayat, Ontario, Calif.

[73] Assignee: Western Digital (Singapore) Pte, Ltd., Singapore

[21] Appl. No.: 928,896

[22] Filed: Aug. 12, 1992

[51] Int. Cl.[5] .................... H03K 3/29; H03K 5/153
[52] U.S. Cl. .................................. 307/290; 307/491
[58] Field of Search ............. 307/290, 491, 572; 328/167

[56] References Cited

U.S. PATENT DOCUMENTS

| | | | |
|---|---|---|---|
| 4,563,595 | 1/1986 | Bose | 307/290 |
| 4,571,504 | 2/1986 | Iwamoto et al. | 307/290 |
| 4,687,954 | 8/1987 | Yasuda et al. | 307/290 |
| 4,733,107 | 3/1988 | O'Shaughnessy et al. | 307/290 |
| 4,859,873 | 8/1989 | O'Shaughnessy | 307/290 |
| 5,113,098 | 5/1992 | Teymouri | 328/167 X |

OTHER PUBLICATIONS

Grebene, Alan B., "Bipolar and MOS Analog Integrated Circuit Design", John Wiley & Sons, Jan. 1984, pp. 556–567.

Primary Examiner—Willis R. Wolfe
Attorney, Agent, or Firm—Koppel & Jacobs

[57] ABSTRACT

A Schmitt trigger circuit that has a separate HI bias circuit, a separate LO bias circuit, and a trigger circuit that includes HI and LO sections that respectively match the circuitry in the HI and LO bias circuits. HI and LO threshold signals are applied to locations in the HI and LO bias circuits that correspond to an input terminal for the trigger circuit, while particular nodes in the bias circuits are connected to corresponding locations in the trigger circuit to set up matching signal levels when the trigger input equals either the HI or the LO threshold levels. The bias circuits include negative feedback paths which inhibit errors due to process, temperature or supply voltage variations, while switching set points are applied to the bias circuits and reflected to the trigger circuit to set the output voltage at a desired level that corresponds to an intermediate point in the switching transition. The circuit can thus be set to be at the middle of a switching transition, with a maximum rate of output voltage change, at the threshold levels.

28 Claims, 3 Drawing Sheets

HIGH SPEED SCHMITT TRIGGER WITH PROCESS, TEMPERATURE AND POWER SUPPLY INDEPENDENCE

BACKGROUND OF THE INVENTION

1. Field of the Invention

This invention relates to Schmitt trigger circuits, and more particularly to Schmitt triggers in which separate bias circuits are provided for setting the Schmitt's switching voltage levels.

2. Description of the Prior Art

A Schmitt trigger circuit functions as a level-detecting comparator with hysteresis. Its output changes from a LO to a HI state when an increasing input signal crosses an upper switching threshold Vhi, and reverts back to its initial state only when the input crosses a lower threshold level Vlo which is less than Vhi. The difference between the two threshold levels, Vhi-Vlo, is the hysteresis associated with the switch. Schmitt trigger circuits are commonly used in applications such as R-C relaxation oscillators; several different designs are described for example in Grebene, *Bipolar and MOS Analog Integrated Circuit Design*, John Wiley & sons, 1984, pages 556–564.

A typical input-output voltage characteristic for a non-inverting Schmitt trigger circuit is illustrated in FIG. 1. The output follows trace 2 when the input rises above the turn-on voltage threshold Vhi, and then follows trace 4 as the input falls back below the turn-off voltage threshold Vlo.

The schematic diagram of a conventional non-inverting CMOS Schmitt trigger is give in FIG. 2. It includes two P-channel field effect transistors (FETs) P1pa and P2pa which have their source-drain current circuits connected in series with the source-drain current circuits of a pair of N-channel FETs N1pa and N2pa ("pa" indicates "prior art"). The P-channel end of the series circuit is connected to a positive voltage supply line Vdd, typically 5 volts, while the N-channel end of the circuit is connected to a lower voltage reference such as ground. An input terminal 6 is connected in common to the gate control electrodes for each of the FETs. A third P-channel device P3pa has its source-drain circuit connected between ground and the junction 8 of the P1pa/P2pa current circuits, while a third N-channel device N3pa has its source-drain circuit connected between Vdd and the junction 10 of the current circuits for N-channel devices N1pa and N2pa. The gate electrodes of P3pa and N3pa are connected together to the junction 12 of the current circuits for P2pa and N1pa, which in turn is connected through an inverter INV1 to an output terminal 14.

In operation, assume that the input signal at terminal 6 is initially LO. The P-channel devices P1pa and P2pa will thus be ON, while the N-channel devices N1pa and N2pa will be OFF. This ties node 12 to a HI state equal to Vdd, which in turn holds P3pa off and N3pa on to set the node 10 HI (less a threshold voltage). The output at terminal 14 at this time is the inverted value of the signal at node 12, or LO.

Assume now that the input voltage at terminal 6 begins to rise. When the input voltage has become great enough, the N-channel devices N1pa and N2pa will become conductive, while the P-channel devices P1pa and P2pa will turn OFF. When conductive FET N2pa connects node 10 to the ground reference, which in turn grounds nodes 12 through N1pa; the result is a HI inverted signal at output terminal 14. However, N2pa has to overcome the connection of Vdd to node 10 (through N3pa) before it can place that node in a LO state. The relative sizings of N1pa, N2pa and N3pa are selected to set the threshold voltage level Vhi at which this transition to a HI output occurs. Conversely, once the trigger circuit output is HI, P3pa is held in a conductive state by virtue of its gate's ground connection through N1pa and N2pa, while P1pa and P2pa are held OFF. For the circuit output at terminal 14 to revert to a L0 state when the input signal at terminal 6 falls, P1pa must become conductive enough to overcome the grounding effects of P3pa and set node 8 at a HI level corresponding to Vdd. This is the point at which the circuit switches back to a LO output, and the relative sizes of P1pa, P2pa and P3pa are selected so that the switching transition occurs at the threshold voltage level Vlo, thus providing the proper amount of hysteresis.

While this circuit is capable of switching at the desired levels Vhi and Vlo when the circuit design is properly implemented, in practice the actual switching points have been found to be sensitive to variations in the manufacturing process, the ambient temperature and the power supply voltage. Such variations in the Vhi and Vlo values impact the voltage hysteresis and the circuit's speed, as well as its absolute switching points. One way to reduce the effects of variations in the manufacturing process is to use metal oxide semiconductor (MOS)FETs with large widths and lengths. Also, to maintain the switching speed requirements, and especially to accommodate a slow process condition, MOSFETs having large width-to-length ratios are employed. However, this requires more chip area for the transistors and increases their switching noise, especially when a fast process condition is encountered. In addition, the circuit is not readily adaptable to various Vdd power supply values. For example, if it is desired to reduce Vdd from 5 V operation down to 3 V operation, the circuit would either have to be redesigned, or a separate Schmitt trigger design for a 3 V supply would have to be provided on the same chip.

A Schmitt trigger design that improves upon the above limitations is disclosed in O'Shaughnessy et al. U.S. Pat. No. 4,859,873, assigned to Western Digital Corporation, the assignee of the present invention. In this patent, independent biased threshold sections are provided for controlling the Vhi and Vlo switching points. A drive disabling switch blocks one of the threshold sections from driving a logic node toward a predetermined logic state, with the drive disabling switch operated to obtain unidirectional sensitivity to the crossing of the threshold voltage level associated with its corresponding threshold section. While the patent represents an improvement over prior designs, it still has certain disadvantages. Among these is the inclusion of a fairly large number of devices in its switching (as opposed to bias) section. Since multiple Schmitt triggers are commonly used on the same chip (for example, an 8-bit bus will normally require eight Schmitt triggers), the provision of multiple switching sections will consume more chip area than is desirable.

Another important limitation of the patented circuit is that, although it controls the input voltage thresholds at which switching is initiated, this does not correspond exactly to the change in output states that results from a switching operation. Since a finite amount of time is required to complete a triggering operation from an OFF to an ON state, the actual input voltage will exceed the nominal Vhi by the time the circuit has actually switched ON in an effective manner; the converse applies when the circuit switches back to an OFF state. The O'Shaughnessy et al. patent also requires the use of a NOR gate in the trigger section that reduces the switching speed. Furthermore, only the input voltage level at which a switching action is initiated, not the voltage level at which effective switching takes place, adjusts to processing and voltage supply variations.

Recognizing its limitation in switching speed, the O'Shaughnessy et al. patent suggests the use of larger current mirrors to obtain larger currents and a correspondingly faster switching operation. However, larger currents generally involve larger device sizes, a higher level of AC power dissipation and an increase in transient noise.

Finally, the patented circuit employs saturated transistors with relatively large drain-source voltage drops in series with other transistors. These voltage drops may not leave enough "head room" to accommodate a drop to a lower Vdd supply, such as going from 5 to 3 volts.

SUMMARY OF THE INVENTION

The present invention seeks to provide a Schmitt trigger circuit that is generally insensitive to normal temperature and process variations, has a fast switching action, sets the point at which the maximum switching transition rather than the initiation of switching takes place, easily accommodates different voltage power supplies, is economical in chip area in terms of both the number of devices required and their sizes, and has relatively low AC power dissipation and transient noise levels.

These goals are accomplished by providing a Schmitt trigger with separate HI and LO bias circuits, and a trigger circuit that has circuitry which matches both of the bias circuits. Matching locations in the bias and trigger circuits are connected together, so that the circuits respond similarly to similar input signals. HI and LO threshold voltages are applied as respective inputs to the HI and LO bias circuits, causing the trigger circuit to switch HI when its input rises through the HI threshold, and to switch back LO when its input thereafter drops through the LO threshold voltage.

Each bias circuit is preferably implemented with transistors of unlike conductivity that are connected in series between a positive voltage power supply and a lower voltage reference; a signal equal to the input switching threshold voltage is applied to the control electrodes of both transistors. Second and third transistors of like polarity to one of the first two transistors are connected in series across that transistor, with the second transistor held in a conductive state and the bias for the trigger circuit taken from the control electrode for the third transistor. Additional transistors of a dummy nature are preferably provided to establish a matching of devices between each of the bias circuits and the trigger circuit.

To provide a close correspondence between the desired input threshold voltages and the voltages at which the maximum switching action actually takes place, set point voltages are set up that control the points of maximum switching rate. The set point voltages are applied to locations in the bias circuits that correspond to the location in the trigger circuit from which the Schmitt trigger output is taken (prior to inversion). The voltage set points for the two bias circuits are preferably equal, with the point of maximum switching occurring at 0.5 Vdd when switching either HI or LO.

The bias circuits are rendered insensitive to process, temperature or Vdd variations through the use of negative feedback circuits that vary the drive to one of the bias circuit transistors in opposition to temperature or processed induced variations. The feedback circuits are preferably implemented with operational amplifiers that are also used to apply the switching set point voltages to the bias circuits, and thereby closely control the circuit's switching action.

These and other features and advantages of the invention will be apparent to those skilled in the art from the following detailed description, taken together with the accompanying drawings.

DETAILED DESCRIPTION

Figure 3:
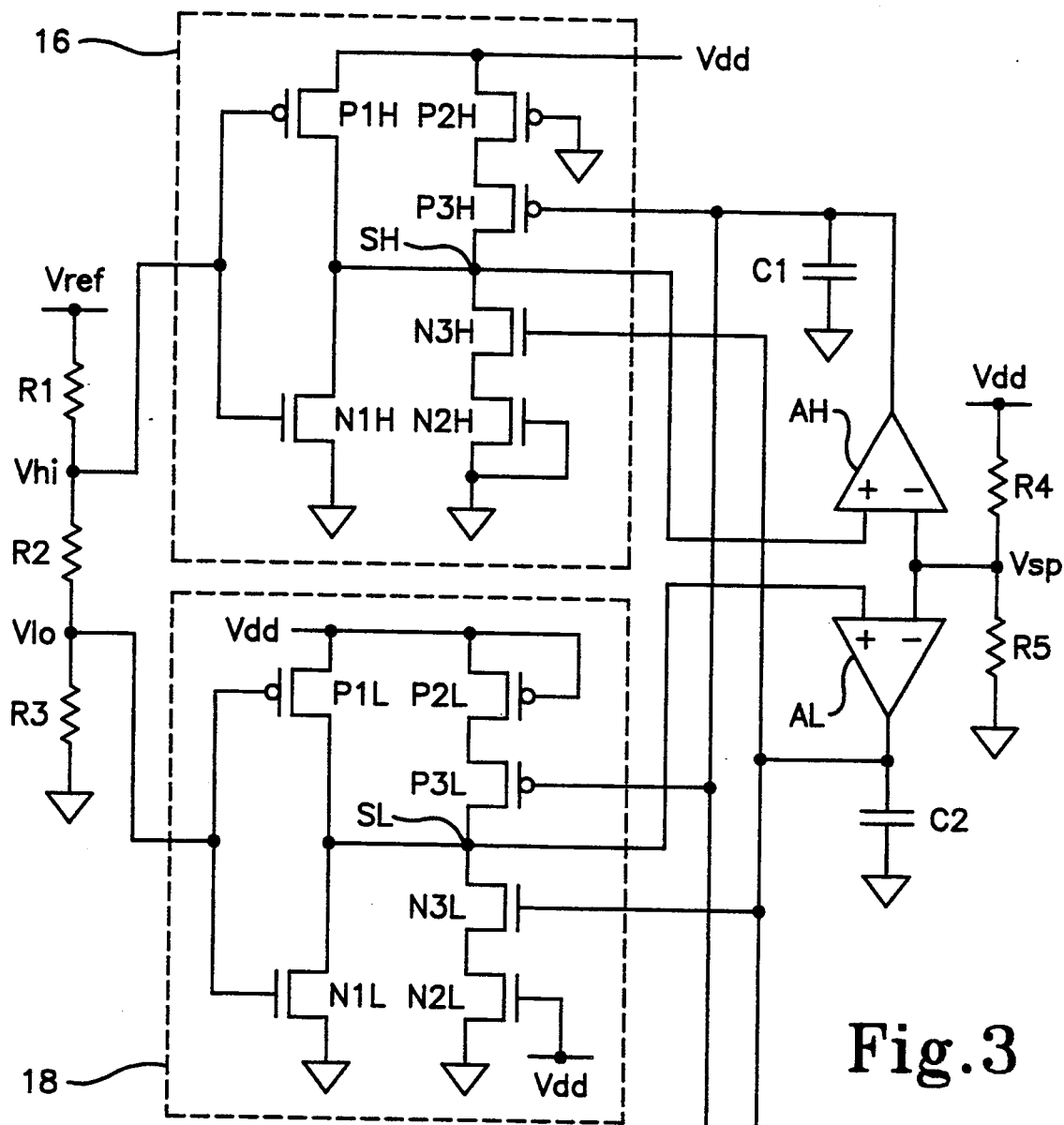
FIG. 3 is a schematic diagram of a preferred circuit used to implement the present invention.

A preferred circuit arrangement for implementing the invention is shown in FIG. 3. The overall Schmitt trigger circuit consists of a HI bias circuit 16 which establishes the Vhi threshold voltage for switching to a HI state, a LO bias circuit 18 which establishes the Vlo voltage at which the Schmitt trigger switches back to a LO output state, and a trigger circuit 20 that actually accomplishes the switching between the HI and LO states under the control of the two bias circuits. The general approach employed in this new circuit is to match the design of the trigger circuit 20 with the designs of the bias circuit 16 and 18. By connecting together corresponding nodes in the bias and trigger circuits, the trigger circuit can be made to follow a signal pattern that is set up in the bias circuits. Negative feedback circuits are employed to maintain constant signal patterns in the bias circuits that are generally insensitive to processing and temperature variations; these unchanging signal patterns are applied to the trigger circuit as process and temperature-invariant switching thresholds. Furthermore, the bias circuit nodes that correspond to the trigger circuit node at which switching actually occurs are set to a fixed known voltage level. This voltage level establishes the trigger circuit's output voltage level at the moment the output voltage is experiencing a maximum rate of change during a switching transition between LO and HI output levels. As explained below, the circuitry thus allows Vhi and Vlo to be set at the midpoint of a switching transition, rather than at its beginning as in previous circuits, and to thus exercise greater control over the Schmitt trigger output.

The operative circuitry of the HI bias circuit 16 consists of transistors P1H and N1H that are connected in series between the positive voltage supply line Vdd and a LO voltage reference, preferably ground, and two additional transistors P2H and P3H that have their current circuits connected in a series circuit that is parallel to the current circuit of P1H. The transistors used are MOSFETs, with P standing for P-channel, N for N-channel and H for their residence in the HI bias circuit 16. The transistor "conductivity" refers to whether it is a P-channel (positive conductivity) or an N-channel (negative conductivity) device for FETs.

The HI bias circuit 16 also includes second and third N-channel FETs N2H and N3H, connected in series between P3H and ground. Transistors N2H and N3H do not participate in the operation of the HI bias circuit, since the gate of N2H is connected to its source to hold both of the transistors OFF. Rather, they serve as "dummy" devices for matching with the trigger circuit 20, described below. Also, transistor P2H is held in a conductive state by grounding its gate.

The design of the LO bias circuit 18 is essentially similar to that of the HI bias circuit 16, but with the "dummy" transistors reversed. That is, in the LO bias circuit transistors P1L, P2L, P3L, N1L, N2L and N3L correspond respectively to P1H, P2H, P3H, N1H, N2H and N3H in the HI bias circuit, but N2L is held conductive by connecting its gate to Vdd, while P2L and P3L are the "dummy" transistors by virtue of a connection between Vdd and the gate of P2L to hold both of the transistors OFF.

The Vhi and Vlo threshold levels are set by applying the higher threshold to the gates of P1H and N1H, and the lower threshold to the gates of P1L and N1L. A convenient circuit for this purpose is the resistive voltage divider consisting of resistors R1, R2 and R3 connected in series between a stable voltage reference Vref and ground. Since R1, R2 and R3 are preferably monolithically integrated on the same chip as the remainder of the circuitry, they will respond in a similar manner to process or temperature variations. Thus, although the absolute resistor values may change, their relative values will remain the same. Vref is established from a source that is generally insensitive to process, temperature and Vdd variations, such as a bandgap voltage reference with good power supply rejection. The Vhi threshold level is tapped from the junction of R1 and R2, while the Vlo threshold setting is tapped from the junction of R2 and R3. As an alternate to the resistive voltage divider, separate threshold setting voltage sources such as a pair of bandgap references could be used, one for the HI bias circuit 16 and the other for the LO bias circuit 18.

The trigger circuit 20 is provided with circuitry that matches the HI and LO bias circuits. Specifically, P- and N-channel FETs P1T and N1T are connected in series between Vdd and ground, P-channel FETs P2T and P3T are connected in a series circuit that parallels P1T, and N-channel FETs N2T and N3T are connected in a series circuit that parallels N1T. Instead of a threshold voltage, the input signal Vin to the Schmitt trigger is applied to the gates of transistors P1T and N1T via an input terminal 22. The junction of P1T and N1T is connected to the junction of P3T and N3T; this node is the circuit location from which the Schmitt trigger output is taken (after inversion). Since it is switched between HI and LO output levels, it is designated as node ST, with S referring to "switching" and T referring to "trigger". The signal at node ST is inverted by an inverter INV2, and the resulting inverted signal at output node 24 constitutes the Schmitt trigger output Vout.

The correspondence between the trigger circuit 20 and the HI and LO bias circuits 16 and 18 can be readily seen by inspecting FIG. 3. The trigger circuit 20 includes a HI section, consisting of transistors P1T, N1T, P2T and P3T, that matches the operative devices P1H, N1H, P2H and P3H in the HI bias 16; and a LO trigger section consisting of P1T, N1T, N2T and N3T that matches the operative circuitry P1L, N1L, N2L and N3L in the LO bias circuit 18. Furthermore, respective switching nodes SH and SL in the HI and LO bias circuits correspond to the switching node ST in the trigger circuit, with corresponding connections made in all three circuits. Bias signals are provided to the trigger circuit by connecting the gate of P3H in the HI bias circuit 16 to the gate of the corresponding transistor P3T in the trigger circuit 20; the gate of transistor N3L in the LO bias circuit 18 is similarly connected to the gate of the corresponding transistor N3T in the trigger circuit 20. (For purposes of circuit balance the gates of P3H and P3L are connected together, as are the gates of N3H and N3L.)

The output of INV2 is fed back to the gates of P2T and N2T, as well as to the output terminal 24. Assume that the input terminal 22 is LO, hence the output terminal 24 is LO. Node 24 being LO causes transistor P2T to be ON and transistor N2T to be OFF. The trigger circuit operates in a manner that resembles the HI bias circuit 16. Since the P1T/N1T series circuit functions as an inverter, the voltage at node ST drops as Vin rises to HI. When the value of Vin reaches Vhi, the voltage at node ST becomes equal to the value of the voltage at node SH in the HI bias circuit 16. When Vin crosses Vhi, node ST slams LO rapidly; Vout at terminal 24 consequently switches to HI. A positive feedback is present that accelerates the switching action. As Vout starts to switch from LO to HI, transistor P2T is turning OFF and transistor N2T is turning ON. P2T going OFF and N2T turning ON speeds node ST in its switching to LO, which in turn helps Vout switch more rapidly to HI. Now that node 24 is HI, P2T is OFF and N2T is ON. The trigger circuit now operates in a manner that resembles the LO bias circuit 18. When the value of Vin drops from HI and reaches Vlo, the voltage at node ST rises and becomes equal to the value of the voltage at node SL in the LO bias circuit 18. When Vin crosses Vlo, node ST slams HI rapidly. Vout at terminal 24 consequently switches to LO. Again, a positive feedback is present that accelerates the switching action. As Vout starts to switch from HI to LO, transistor P2T is turning ON and transistor N2T is turning OFF. This speeds ST in its switching to HI, which in turn helps Vout switch more rapidly to LO.

The symmetry between the HI bias circuit 16 and the trigger circuit 20 is completed when Vin at terminal 22 is equal to the Vhi signal applied to the gates of P1H and N1H. With this condition, the voltages at all corresponding locations in the two circuits will be equal. Specifically, the voltages at switching nodes ST and SH will be equal. This feature is used, as described below, to force the terminal ST to the desired set voltage level, between fully HI and fully LO, when Vin is equal to Vhi. A similar situation applies when Vin is equal to Vlo, except in this case the Schmitt trigger output is controlled by the LO bias circuit 18.

Negative feedback circuits are provided to inhibit changes in the HI and LO bias voltages applied to the trigger circuit, despite process or temperature variations. The feedback circuits are preferably implemented with operational amplifiers AH for the HI bias circuit, and AL for the LO bias circuit. The non-inverting input to op amp AH is connected to node SH in the HI bias circuit, while its output is connected to the gate of P3H and to a holding capacitor C1. A constant voltage reference is supplied to the inverting input of op amp AH from a resistive voltage divider, which consists of resistors R4 and R5 connected between Vdd and ground. A corresponding negative feedback circuit is provided for the LO bias circuit 18, with an op amp AL having its non-inverting input connected to node SL, its output connected to the gate of transistor N3L and to a holding capacitor C2, and its inverting input also connected to the voltage divider R4, R5. While separate voltage references could be supplied for the inverting inputs of AH and AL, a single reference is preferably provided from the junction of R4 and R5. By setting R4 and R5 at equal resistance values, the inverting inputs to AH and AL are each set at one half Vdd. As discussed below, this establishes a highly advantageous switching set point for both the transitions from LO to HI, and from HI back to LO.

To understand the operation of the op amp circuits in holding constant bias levels for the trigger circuit despite process, temperature or Vdd variations, assume that such variations result in the P-channel transistors being "stronger" (having a greater current/voltage ratio for a given gate voltage). In this situation P1H, P2H and P3H in the HI bias circuit 16 will tend to pull the voltage at node SH higher towards Vdd, so that the SH voltage increases. As the SH voltage rises with respect to Vsp (the set point voltage between R4 and R5), the output voltage of op amp AH also increases. As a result the gate drive of transistor P3H is reduced, thus reducing that transistor's strength with respect to the N-channel transistors. This in turn bucks the original increase in the voltage at node SH, holding the voltage at that node relatively stable. Conversely, if the P-channel devices are weaker than the N-channel devices, the voltage at node SH will tend to drop. This causes the output voltage of op amp AH to go down, increasing the gate drive on P3H and thus increasing its strength with respect to the N-channel devices. As a result the voltage at node SH again tends to stabilize at the Vsp set point level. A similar stabilizing effect occurs in the LO bias circuit 18 due to the negative feedback action of op amp AL.

Figure 4:
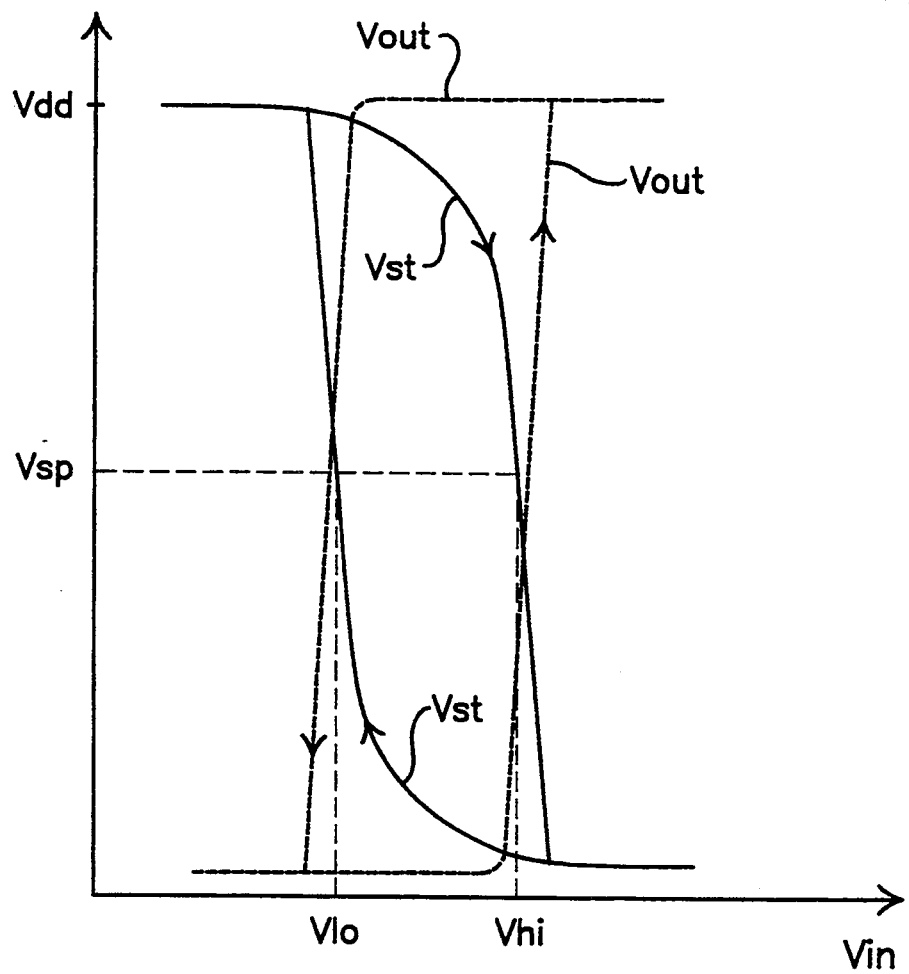
FIG. 4 is a voltage plot illustrating the switching control achieved with the invention.

The Vsp voltage that is applied to SH and SL modulates the threshold voltages of P1H, N1H, P1L and N1L. Although these devices remain in their ON states established by Vhi and Vlo, their modulated thresholds are reflected to P1T and N1T in the trigger circuit. This results in the voltage Vsp establishing a switching set point at which the maximum rate of voltage change occurs during a switching transition from LO to HI, or from HI to LO. This is illustrated in FIG. 4, in which a hysteresis curve for the improved Schmitt trigger circuit is presented with the scale of the horizontal Vin axis somewhat exaggerated. Instead of Vhi and Vlo occurring near the beginning of a switching transition as in previous circuit designs, with the remainder of the switching operations uncontrolled, the circuit of FIG. 3 causes the voltage $V_{ST}$ at terminal ST to equal the value of Vsp at the desired switching thresholds Vhi and Vlo. By setting R4 equal to R5 so that Vsp equals one-half Vdd, $V_{ST}$ will be at one-half Vdd when the input voltage either rises through Vhi or falls back through Vlo. This control over the midpoint of the switching transition, rather than the point at which the transition first begins, provides a considerably more precise control over the effective switching threshold levels. The corresponding output voltage Vout at terminal 24 is indicated by the hysteresis curve in dashed lines.

The circuit operation in establishing the voltage set points is as follows. The op amps AH and AL operate in the conventional manner to force their two inputs to a common voltage level. Since their inverting inputs are fixed at Vsp, their non-inverting inputs force the voltages at nodes SH and SL to the same Vsp level. Thus, since the voltages within trigger circuit 20 match those of the HI bias circuit 16 when Vin is equal to Vhi, the voltage at node ST in the trigger circuit will be equal to the Vsp voltage at node SH in the HI bias circuit under these circumstances. Conversely, the voltage levels in the trigger circuit will match those in the LO bias circuit 18 when Vin is equal to Vlo. The voltage at trigger circuit node ST will thus equal the voltage at LO bias circuit SL, which is equal to Vsp or whatever other value may be selected for node SL under these conditions.

The ability to establish a voltage set point for an intermediate region of the switching transitions, rather than setting Vhi and Vlo only for the beginnings of the switching transitions, is an important advantage over the O'Shaughnessy et al. patent. In O'Shaughnessy et al. the ability to adjust for process variations effects only the beginning of a switching transition. With the present invention, by contrast, a more precise compensation is achieved for both process, temperature and Vdd variations by adjusting the midpoint of the switching cycle. Furthermore, by avoiding the use of a NOR gate and replacing multiple device stacking between the input and output terminals with only two inverters, the present invention achieves a substantially faster switching action. The maintenance of invariant Vhi and Vlo voltage levels is also kept independent of the transistor sizes, allowing small transistors to be used with an accompanying reduction in area requirements and switching noise. The avoidance of large currents that might otherwise be necessary to obtain a rapid switching action also yields a lower transient noise level, as well as a lower AC power dissipation.

Another advantage of the circuit is that it easily accommodates power supply Vdd requirements, such as a reduction from 5 to 3 volts. In the HI bias circuit 16 the transistors P1H and P3H are essentially connected in parallel with each other; P2H is fully ON and thus does not bear an appreciable voltage drop. This parallel connection avoids the "head room" limitation associated with the series circuit in the O'Shaughnessy et al. patent. The feedback voltages at the inputs to transistors P3H and N3L automatically compensate for changes in Vdd, so long as Vref is maintained independent of Vdd.

Figure 1:
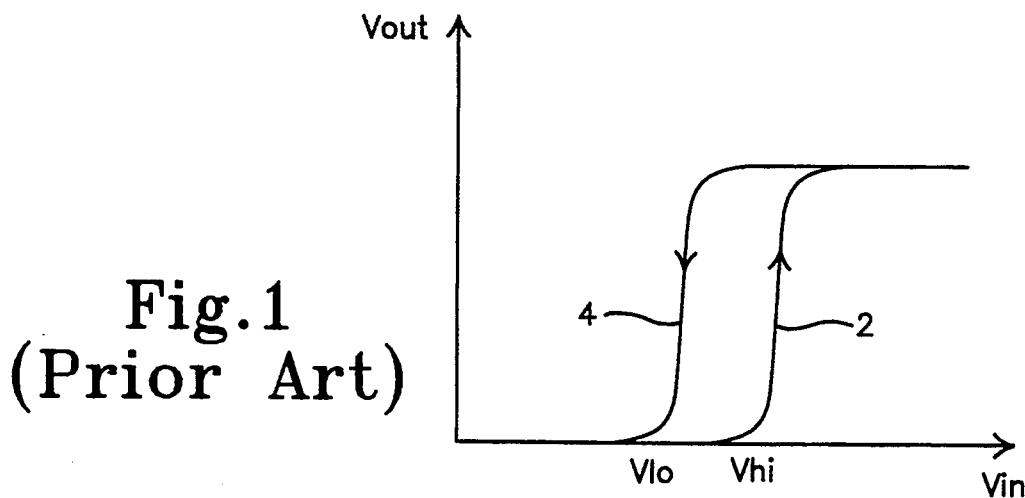
FIG. 1 is voltage plot of a typical Schmitt trigger operation, described above.
Figure 2:
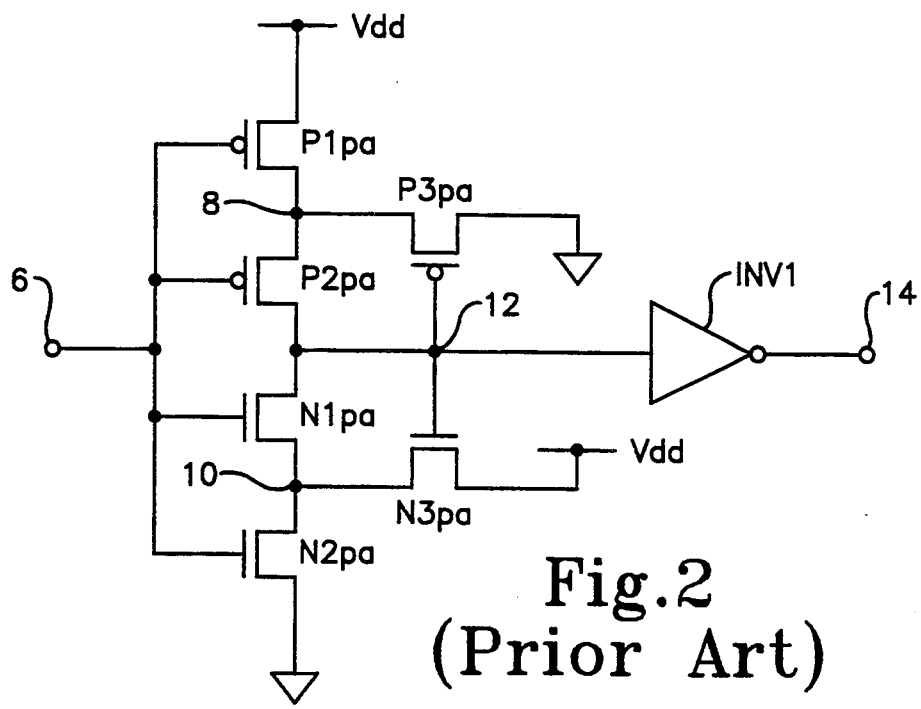
FIG. 2 is a simplified schematic diagram of a prior Schmitt trigger circuit design, described above.
Figure 5:
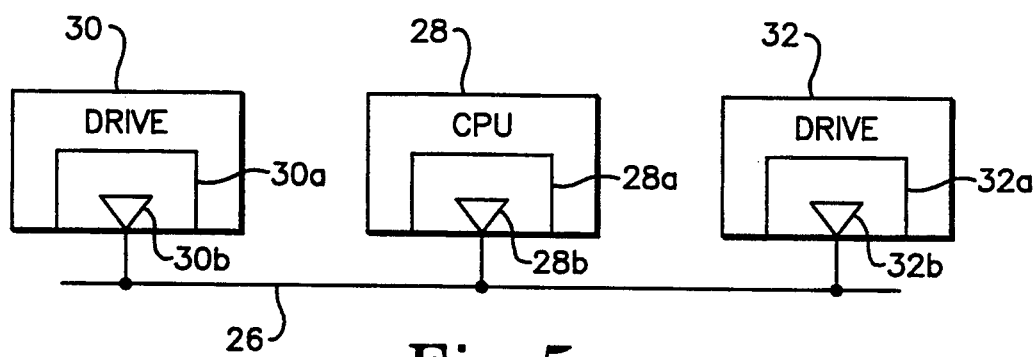
FIG. 5 is a simplified block diagram illustrating the use of Schmitt trigger circuits in accordance with the invention in a computer environment.

Given its ability to set a large hysteresis, consume less chip area and reduce switching noise, a Schmitt trigger circuit implemented in accordance with the invention is an excellent candidate for small computer system interface (SCSI) applications. FIG. 5 illustrates a simplified form of such a system. The SCSI bus 26 connects a central processing unit (CPU) 28 with various disk drives 30, 32. Each unit tied to the SCSI bus 26 is provided with an SCSI chip 28a, 30a, 32a, within which a Schmitt trigger circuit 28b, 30b, 32b is employed. The SCSI chips and their associated Schmitt triggers can be used either for CPU-DRIVE communications, or for DRIVE-DRIVE communications.

Figure 6:
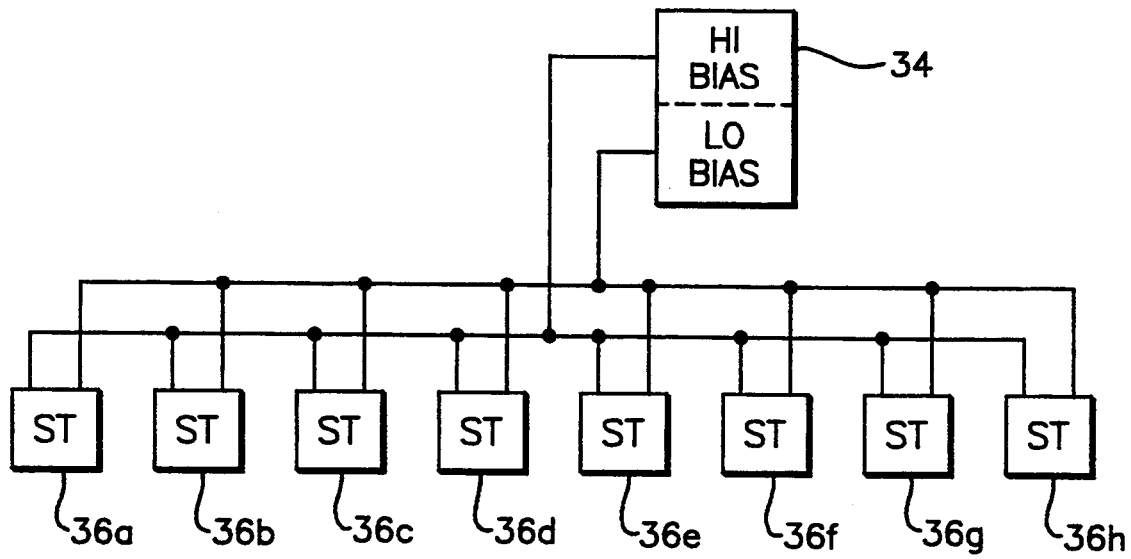
FIG. 6 is a simplified block diagram illustrating the use of a single set of bias circuits in conjunction with multiple trigger circuits.

Another distinct advantage is a reduction in the chip area required for the circuit when multiple Schmitt triggers are used. This is typically the case; an 8-bit device would normally use eight Schmitt triggers, one for each bit. The present invention allows multiple trigger circuits to be controlled by a common set of bias circuits. This is illustrated in FIG. 6, in which a single bias circuit 34 that has HI and LO sections is shown biasing eight separate trigger sections 36a–36h. Each trigger circuit receives the same bias signals, although the inputs to the various trigger circuits and thus their outputs may be different at any given time. Since the trigger circuit 20 is on the order of one-fourth the area of prior Schmitt trigger circuits, a considerable area savings is made possible.

While a particular embodiment of the invention has been shown and described, numerous variations and alternate embodiments will occur to those skilled in the art. Accordingly, it is intended that the invention be limited only in terms of the appended claims.

I claim:

1. A Schmitt trigger circuit, comprising:
   means for establishing HI and LO threshold voltages,
   a HI bias circuit having operative circuitry that is responsive to said HI threshold voltage for establishing a HI bias signal,
   a LO bias circuit having operative circuitry that is responsive to said LO threshold voltage for establishing a LO bias signal, and
   a trigger circuit that is connected to receive an input signal, said trigger circuit including:
      a HI section that substantially matches the operative circuitry of said HI bias circuit, and is biased by said HI bias signal to switch from a LO to a HI trigger circuit output in response to said input signal rising from a level below said LO threshold voltage to a level above said HI threshold voltage,
      a LO section that substantially matches the operative circuitry of said LO bias circuit, and is biased by said LO bias signal to switch from a HI to a LO trigger circuit output in response to said input signal falling from a level above said HI threshold voltage to a level below said LO threshold voltage, and
   at least one additional trigger circuit that is substantially similar to the first trigger circuit and is similarly biased by said HI and LO bias circuits.

2. A Schmitt trigger circuit, comprising:
   means for establishing HI and LO threshold voltages,
   a HI bias circuit having operative circuitry that is responsive to said HI threshold voltage for establishing a HI bias signal,
   a LO bias circuit having operative circuitry that is responsive to said LO threshold voltage for establishing a LO bias signal, and
   a trigger circuit that is connected to receive an input signal, said trigger circuit including:
      a HI section that substantially matches the operative circuitry of said HI bias circuit, and is biased by said HI bias signal to switch from a LO to a HI trigger circuit output in response to said input signal rising from a level below said LO threshold voltage to a level above said HI threshold voltage,
      a LO section that substantially matches the operative circuitry of said LO bias circuit, and is biased by said LO bias signal to switch from a HI to a LO trigger circuit output in response to said input signal falling from a level above said HI threshold voltage to a level below said LO threshold voltage, said HI and LO bias circuits each including positive and negative conductivity transistors, and further comprising respective negative feedback circuits for said bias circuits, the negative feedback circuit for each bias circuit being connected to vary the drive to a transistor of one polarity within its bias circuit to oppose changes in the relative strengths of the transistors of that polarity due to process, temperature or power supply variations.

3. The Schmitt trigger circuit of claim 2, further comprising means for establishing a set point voltage that is substantially insensitive to temperature and process variations, said negative feedback circuits comprising respective operational amplifiers having first inputs from said set point voltage, second inputs from respective locations in said HI and LO bias circuits, and outputs that are connected to control the drives to respective transistors in said bias circuits.

4. A schmitt trigger bias circuit, comprising:
   first transistors of opposite conductivity having respective control electrodes connected to receive a common threshold voltage signal, and respective current circuits connected in series between a positive voltage supply line and a lower voltage reference,
   second and third transistors of like conductivity to one of said first transistors, said second and third transistors having respective control electrodes, and respective current circuits connected in a series circuit that is in parallel with the like conductivity first transistor,
   means connected to the control electrode of said second transistor holding said transistor in a conductive state, and
   a negative feedback circuit connected between the series connection for said first transistors and the control electrode for said third transistor to vary the drive to said third transistor in opposition to relative changes in the strengths of said opposite polarity transistors due to process, temperature or Vdd variations,
   the control electrode for said third transistor providing a Schmitt trigger bias signal.

5. The Schmitt trigger bias circuit of claim 4, said feedback circuit comprising an operational amplifier having a first input connected to the series connection for said first transistors, a second input connected to a substantially constant voltage source, and an output connected to the control electrode for said third transistor.

6. A switch circuit that is generally insensitive to normal temperature, process and power supply variations, comprising:
   a bias circuit having operative circuitry that responds to a predetermined threshold signal to establish a bias signal, and
   a trigger circuit that is connected to receive an input signal, said trigger circuit including circuitry that substantially matches the operative circuitry of said bias circuit, and being biased by said bias signal to switch between LO and HI output states in response to said input signal traversing said threshold signal, corresponding nodes in the matching circuitry of said bias circuit and said trigger circuit being connected together to bias said trigger section, the operative circuitry of said bias circuit comprising:

first transistors of opposite conductivity having respective control electrodes connected to receive said threshold signal, and respective current circuits connected in series between a positive voltage supply line and a lower voltage reference, second and third transistors of like conductivity having respective control electrodes, and respective current circuits connected in a series circuit that is in parallel with the like conductivity first transistor, and means connected to the control electrode of said second transistor holding said transistor in a conductive state, the control electrode of said third transistor being connected to provide a bias signal to a matching circuit location in said trigger circuit, and an output from said trigger circuit being taken from an output location that matches the location of the series connection between said first transistors of the bias circuit.

7. The switch circuit of claim 6, further comprising an inverter that has an input connected to the output circuit location of said trigger circuit, and an output that provides the output for the switch circuit, said inverter output being connected to a circuit location in the trigger circuit that matches the control electrode for the second transistor in the bias circuit.

8. A fast response Schmitt trigger circuit, comprising:

a trigger circuit that is connected to receive an input signal and to produce an output signal in response thereto, a HI bias circuit biasing said trigger circuit to switch from a LO to a HI output when said input signal rises from a level below a LO threshold voltage to a level above a HI threshold voltage, a LO bias circuit biasing said trigger circuit to switch from a HI to a LO output when said input signal falls from a level above said HI threshold voltage to a level below said LO threshold voltage, means for establishing and applying to said HI and LO bias circuits respective switching set point voltages, and means interconnecting said HI and LO bias circuits with said trigger circuit so that the rate of change in the trigger circuit output is maximized, when the trigger circuit switches from a LO to a HI output, at the switching set point voltage for the HI bias circuit and is maximized when the trigger circuit switches from a HI to a LO output at the switching set point voltage for the LO bias circuit.

9. The Schmitt trigger circuit of claim 8, said HI and LO bias circuits include circuitry that substantially matches the circuitry of said trigger circuit, said trigger circuit includes a switching node from which the trigger output signal is taken, and said HI and LO bias circuits receive their respective switching set point voltages at circuit nodes that are matched with said trigger circuit switching node.

10. The Schmitt trigger circuit of claim 9, wherein said means for establishing said switching set point voltages establishes a common set point voltage for said HI and LO bias circuits.

11. The Schmitt trigger of claim 10, wherein said common set point voltage is midway between said HI and LO trigger circuit outputs.

12. The Schmitt trigger of claim 10, said HI and LO bias circuits and said trigger circuit each being connected between a positive voltage supply line and a lower voltage reference, wherein said means for establishing said common set point voltage comprises a resistive voltage divider circuit connected between said positive voltage supply line and said lower voltage reference, with said common set point voltage tapped from said voltage divider circuit.

13. A Schmitt trigger circuit, comprising:

means for establishing HI and LO threshold voltages, a HI bias circuit having operative circuitry that is responsive to said HI threshold voltage for establishing a HI bias signal, a LO bias circuit having operative circuitry that is responsive to said LO threshold voltage for establishing a LO bias signal, and a trigger circuit that is connected to receive an input signal, said trigger circuit including:

a HI section that substantially matches the operative circuitry of said HI bias circuit, and is biased by said HI bias signal to switch from a LO to a HI trigger circuit output in response to said input signal rising from a level below said LO threshold voltage to a level above said HI threshold voltage, a LO section that substantially matches the operative circuitry of said LO bias circuit, and is biased by said LO bias signal to switch from a HI to a LO trigger circuit output in response to said input signal falling from a level above said HI threshold voltage to a level below said LO threshold voltage, and means for establishing and applying to said HI bias circuit a switching set point voltage at which the rate of change in the trigger circuit output during a transition from a LO to a HI trigger circuit output level is maximized, and to said LO bias circuit a switching set point voltage at which the rate of change in the trigger circuit output during a transition from a HI to a LO trigger circuit output level is maximized.

14. The Schmitt trigger circuit of claim 13, wherein said means for establishing said switching set point voltages establishes a common set point voltage for said HI and LO bias circuits.

15. The Schmitt trigger circuit of claim 14, wherein said common set point voltage is midway between said HI and LO trigger circuit outputs.

16. The Schmitt trigger circuit of claim 14, said HI and LO bias circuits and said trigger circuit each being connected between a positive voltage supply line and a lower voltage reference, wherein said means for establishing said common set point voltage comprises a resistive voltage divider circuit connected between said positive voltage supply line and said lower voltage reference, with said common set point voltage tapped from said voltage divider circuit.

17. The Schmitt trigger circuit of claim 13, said trigger circuit including a trigger switching node from which said trigger circuit output is obtained, the operative circuitry of said HI and LO bias circuits including respective HI and LO bias switching nodes that substantially match said trigger switching node within their respective bias circuits, and said means for applying said switching set point voltages to said HI and LO bias circuits comprises means for applying said switching set point voltages to said bias switching nodes.

18. The Schmitt trigger circuit of claim 17, said means for applying said switching set point voltages to said bias switching nodes comprising respective operational amplifiers (op amps) for said HI and LO bias circuits, the HI bias circuit op amp having one input connected to receive the switching set point voltage for the HI bias circuit and another input connected to the HI bias switching node, and the LO bias circuit op amp having one input connected to receive the switching set point voltage for the LO bias circuit and another input connected to the LO bias switching node.

19. The Schmitt trigger circuit of claim 18, wherein corresponding nodes in the matching circuitry of said HI bias circuit and said HI trigger circuit section are connected together to bias said HI trigger circuit section, and corresponding nodes in the matching circuitry of said LO bias circuit and said LO trigger circuit section are connected together to bias said LO trigger circuit section, the output of the HI bias circuit op amp is connected to said corresponding nodes in the matching circuitry of the HI bias circuit and the HI trigger circuit section, and the output of the LO bias circuit op amp is connected to said corresponding nodes in the matching circuitry of the LO bias circuit and the LO trigger circuit section.

20. A Schmitt trigger circuit, comprising:
means for establishing HI and LO threshold voltages,
a HI bias circuit having operative circuitry that is responsive to said HI threshold voltage for establishing a HI bias signal,
a LO bias circuit having operative circuitry that is responsive to said LO threshold voltage for establishing a LO bias signal, and
a trigger circuit that is connected to receive an input signal, said trigger circuit including:
a HI section that substantially matches the operative circuitry of said HI bias circuit, and is biased by said HI bias signal to switch from a LO to a HI trigger circuit output in response to said input signal rising from a level below said LO threshold voltage to a level above said HI threshold voltage, and
a LO section that substantially matches the operative circuitry of said LO bias circuit, and is biased by said LO bias signal to switch from a HI to a LO trigger circuit output in response to said input signal falling from a level above said HI threshold voltage to a level below said LO threshold voltage, corresponding nodes in the matching circuitry of said HI bias circuit and said HI trigger circuit section being connected together to bias said HI trigger circuit section, and corresponding nodes in the matching circuitry of said LO bias circuit and said LO trigger circuit section being connected together to bias said LO trigger circuit section,
the operative circuitry of said HI bias circuit including:
a positive voltage supply line,
a lower voltage reference,
first, second and third positive conductivity transistors and a first negative conductivity transistor having respective control electrodes and current circuits,
said first positive and first negative conductivity transistors being connected with their current circuits in series between said positive voltage supply line and said lower voltage reference,
said second and third positive conductivity transistors being connected with their current circuits in a series circuit that is connected in parallel with the current circuit of said first positive conductivity transistor,
means for applying said HI switching voltage to the control electrodes of said first positive and first negative conductivity transistors, and
means setting said second positive conductivity transistor in an ON state.

21. The Schmitt trigger circuit of claim 20, said trigger circuit HI section including first, second and third positive polarity transistors and a first negative polarity transistor that are connected in a circuit that substantially matches the operative circuitry of said HI bias circuit, with the control electrodes of the third positive polarity transistors for said HI bias circuit and said HI trigger circuit section connected together to bias said HI trigger circuit section.

22. The Schmitt trigger circuit of claim 21, further comprising an inverter that has an input connected to the connection between said first positive and negative conductivity HI trigger section transistors, and an output that provides the output for the Schmitt trigger circuit, said inverter output being connected to the control electrode for the second positive polarity transistor of said HI trigger section.

23. The Schmitt trigger circuit of claim 20, the operative circuitry of said LO bias circuit including:
said positive voltage supply line and said lower voltage reference,
first, second and third negative conductivity transistors and a first positive conductivity transistor having respective control electrodes and current circuits,
said first negative and first positive conductivity transistors for the LO bias circuit being connected with their current circuits in series between said positive voltage supply line and said lower voltage reference,
said second and third negative conductivity transistors for the LO bias circuit being connected with their current circuits in a series circuit that is connected in parallel with the current circuit of the first negative conductivity transistor for said LO bias circuit,
means for applying said LO switching voltage to the control electrodes for said first negative and first positive transistors of said LO bias circuit, and
means for setting said second negative conductivity transistor of said LO bias circuit in an ON state.

24. The Schmitt trigger circuit of claim 23, wherein said trigger circuit HI section includes first, second and third positive polarity transistors and a negative polarity transistor that are connected in a circuit that substantially matches the operative circuitry of said HI bias circuit, with the control electrodes of the third positive polarity transistors for said HI bias circuit and said HI trigger circuit section connected together to bias said HI trigger circuit section, and
said trigger circuit LO section includes said first negative and first positive polarity HI section transistors and second and third negative polarity transistors connected in a circuit that substantially matches the operative circuitry of said LO bias circuit, with the control electrodes of the third negative polarity transistors for said LO bias circuit and said LO trigger circuit section connected to bias said LO trigger circuit section.

25. The Schmitt trigger circuit of claim 24, said HI bias circuit further comprising second and third negative polarity transistors that substantially match the second and third negative polarity transistors of said trigger circuit LO section and are connected in series between the third positive polarity transistor of said HI bias circuit and said voltage reference, and means rendering said second and third negative polarity HI bias circuit transistors non-conductive, and said LO bias circuit further comprising second and third positive polarity transistors that substantially match the second and third positive polarity transistors of said trigger circuit HI section and are connected in series between the third negative polarity transistor of said LO bias circuit and said positive voltage supply line, and means rendering said second and third positive polarity LO bias circuit transistors non-conductive.

26. The Schmitt trigger circuit of claim 24, said positive polarity transistors comprising P-channel field effect transistors (FETs), and said negative polarity transistors comprising N-channel FETs.

27. The Schmitt trigger circuit of claim 24, further comprising an inverter that has an input connected to the connection between said first positive and negative conductivity transistors for said HI and LO trigger circuit sections, and an output that provides the output for the Schmitt trigger circuit, said inverter output being connected in positive feedback loops to said trigger circuit HI and LO sections to increase the switching speed of said sections.

28. The Schmitt trigger circuit of claim 27, said positive feedback loops comprising circuit connections between the inverter output and the control electrodes for the second positive polarity transistor of said HI trigger section and the second negative polarity transistor of said LO trigger section.

* * * * *